(12) United States Patent
Otsuka et al.

(10) Patent No.: US 11,742,134 B2
(45) Date of Patent: Aug. 29, 2023

(54) COIL COMPONENT AND CIRCUIT BOARD HAVING THE SAME

(71) Applicant: TDK Corporation, Tokyo (JP)

(72) Inventors: Masato Otsuka, Tokyo (JP); Kouyu Ohi, Yamagata (JP); Yusuke Kimoto, Tokyo (JP); Setu Tsuchida, Yamagata (JP)

(73) Assignee: TDK CORPORATION, Tokyo (JP)

( * ) Notice: Subject to any disclaimer, the term of this patent is extended or adjusted under 35 U.S.C. 154(b) by 225 days.

(21) Appl. No.: 17/159,398

(22) Filed: Jan. 27, 2021

(65) Prior Publication Data

US 2021/0233702 A1 Jul. 29, 2021

(30) Foreign Application Priority Data

Jan. 27, 2020 (JP) .................. 2020-010581

(51) Int. Cl.
*H01F 27/24* (2006.01)
*H01F 27/28* (2006.01)
(Continued)

(52) U.S. Cl.
CPC ......... *H01F 27/2823* (2013.01); *H01F 27/24* (2013.01); *H01F 27/292* (2013.01);
(Continued)

(58) Field of Classification Search
CPC .... H01F 27/006; H01F 27/24; H01F 27/2823; H01F 27/2828; H01F 27/292; H01F 27/28; H01F 27/29; H01F 2027/065; H01F 41/069; H01F 17/04; H01F 17/045; H01F 27/06; H01F 2017/0093; H05K 1/11; H05K 1/181; H05K 1/18; H05K 2201/1003; H03H 1/00; H03H 2001/0035; H03H 2001/0092; H03H 7/09; H03H 7/427
(Continued)

(56) References Cited

U.S. PATENT DOCUMENTS 3,419,835 A * 12/1968 Stein ................... H01F 27/2871
29/605
2014/0292463 A1 10/2014 Lai et al.
(Continued)

FOREIGN PATENT DOCUMENTS

CN 109754988 A * 5/2019 ............. H01F 17/04
CN 209133297 U 7/2019
(Continued)

*Primary Examiner* — Timothy J Thompson
*Assistant Examiner* — Guillermo J Egoavil
(74) *Attorney, Agent, or Firm* — McDermott Will & Emery LLP

(57) ABSTRACT

Disclosed herein is a coil component that includes a core, first to fourth terminal electrodes provided on a first flange part, fifth to eighth terminal electrodes provided on a second flange part, first and second wires bifilar wound around a winding core part, and third and fourth wires bifilar wound around the winding core part. One and other ends of the first to eighth wires are connected corresponding one of the first to eighth terminal electrodes. The first and second wires cross each other in a first crossing area. The third and fourth wires cross each other in a second crossing area different from the first crossing area.

15 Claims, 7 Drawing Sheets

(51) Int. Cl.
*H01F 27/29* (2006.01)
*H05K 1/11* (2006.01)
*H05K 1/18* (2006.01)

(52) U.S. Cl.
CPC .............. *H05K 1/11* (2013.01); *H05K 1/181* (2013.01); *H05K 2201/1003* (2013.01)

(58) Field of Classification Search
USPC .......................................... 174/260; 336/220
See application file for complete search history.

(56) References Cited

U.S. PATENT DOCUMENTS

| | | | | |
|---|---|---|---|---|
| 2014/0292465 | A1* | 10/2014 | Takagi | H01F 27/292 336/192 |
| 2017/0196093 | A1 | 7/2017 | Takagi et al. | |
| 2018/0366255 | A1* | 12/2018 | Mikogami | H01F 27/24 |
| 2019/0228901 | A1* | 7/2019 | Asai | H01F 17/045 |
| 2020/0013541 | A1* | 1/2020 | Mikogami | H01F 27/006 |
| 2020/0105464 | A1* | 4/2020 | Kobayashi | H01F 17/045 |
| 2021/0012949 | A1* | 1/2021 | Miyamoto | H01F 27/324 |

FOREIGN PATENT DOCUMENTS

| | | | | |
|---|---|---|---|---|
| JP | 2008-186996 A | | 8/2008 | |
| JP | 2008186996 A | * | 8/2008 | ............. H01F 17/04 |
| JP | 2014-199906 A | | 10/2014 | |

* cited by examiner

COIL COMPONENT AND CIRCUIT BOARD HAVING THE SAME

BACKGROUND OF THE INVENTION

Field of the Invention

The present invention relates to a coil component and a circuit board having the same and, more particularly, to a coil component capable of being used as a pulse transformer and a circuit board having such a coil component.

Description of Related Art

As a coil component capable of being used as a pulse transformer, one described in JP 2014-199906A is known, for example. The coil component described in JP 2014-199906A is an eight-terminal-type coil component in which flange parts on both sides thereof each have four terminal electrodes, and four wires are wound around a winding core part thereof. One end of one of two paired wires and one end of the other one thereof are short-circuited on a circuit board to constitute a center tap of a primary side coil, and one end of one of the remaining two paired wires and one end of the other one thereof are short-circuited on the circuit board to constitute a center tap of a secondary side coil.

However, in the coil component described in JP 2014-199906A, two terminal electrodes constituting the center tap are provided on the same flange part, so that it is necessary to wind the two paired wires in mutually opposite directions, complicating the winding operation. In addition, when the number of turns of a primary side coil and that of a secondary side coil are different, one of the two wires constituting the primary side coil and one of the two wires constituting the secondary coil cannot be wound simultaneously. It follows that the four wires need to be wound one by one, thus taking time in the winding operation.

SUMMARY

It is therefore an object of the present invention to provide a coil component in which wire winding operation is facilitated even when the primary side coil and the secondary side coil differ in the number of turns and a circuit board having such a coil component.

A coil component according to the present invention includes: a core including a first flange part, a second flange part, and a winding core part positioned between the first and second flange parts; first, second, third, and fourth terminal electrodes provided on the first flange part; fifth, sixth, seventh, and eighth terminal electrodes provided on the second flange part; first and second wires bifilar wound around the winding core part; and third and fourth wires bifilar wound around the winding core part. One and the other ends of the first wire are connected respectively to the first and sixth terminal electrodes, one and the other ends of the second wire are connected respectively to the second and fifth terminal electrodes, one and the other ends of the third wire are connected respectively to the third and eighth terminal electrodes, and one and the other ends of the fourth wire are connected respectively to the fourth and seventh terminal electrodes. The first and second wires cross each other in a first crossing area, and the third and fourth wires cross each other in a second crossing area different from the first crossing area.

According to the present invention, the first and second wires are bifilar wound, and third and fourth wires are bifilar wound, thus facilitating wire winding operation. Further, the first and second wires cross each other, and the third and fourth wires cross each other, so that, when a center tap is constituted by short-circuiting two terminal electrodes on a circuit board, it is possible to simplify the pattern shape of a connection pattern for short-circuiting the two terminal electrodes. In addition, the first crossing area where the first and second wires cross each other and the second crossing area where the third and fourth wires cross each other differ in position, so that it is possible to prevent breakage, winding collapse, and the like of the wires due to interference between the two crossing areas.

In the present invention, the turn number of the first and second wires in the first crossing area when the first flange part is defined as the starting point of winding and the turn number of the third and fourth wires in the second crossing area when the first flange part is defined as the starting point of winding may differ from each other. With this configuration, it is possible to easily prevent interference between the two crossing areas. In this case, the first turns of the first and second wires may cross each other in the first crossing area when the first flange part is defined as the starting point of winding, and the first turns of the third and fourth wires may cross each other in the second crossing area when the second flange part is defined as the starting point of winding. This further facilitates wire winding operation.

In the present invention, the winding core part may have a plurality of winding surfaces, and the first and second crossing areas may be positioned on the mutually different winding surfaces. This can reliably prevent interference between the two crossing areas. In this case, the plurality of winding surfaces may include first, second, and third winding surfaces, wherein the extending length of the first, second, third, and fourth wires on the first winding surface may be longer than the extending length of the first, second, third, and fourth wires on the second and third winding surfaces, and the first and second crossing areas may be positioned on the second and third winding surfaces, respectively. With this configuration, two wires cross each other on the winding surface on which the wire extending length is shorter, so that the positions of the wires near the crossing point can be fixed at the corners of the winding core part.

In the present invention, the number of turns of the first and second wires and the number of turns of the third and fourth wires may differ from each other. Even in this case, the first and second wires can be bifilar wound, and the third and fourth wires can be bifilar wound, thus facilitating wire winding operation. In this case, the number of turns of the first and second wires may be larger than the number of turns of the third and fourth wires, and the third and fourth wires may be wound around the winding core part with the first and second wires interposed therebetween. This allows the first to fourth wires to be wound in an aligned manner.

In the present invention, the first, second, third, and fourth terminal electrodes may be arranged in this order in a direction perpendicular to the axial direction of the winding core part, and the fifth, sixth, seventh, and eighth terminal electrodes may be arranged in this order in a direction perpendicular to the axial direction of the winding core part. This allows the paired two wires to be brought close to each other.

A circuit board according to the present invention includes a substrate and the above-described coil component mounted on the substrate. The substrate includes: first to eighth land patterns connected respectively to the first to eighth terminal electrodes; a connection pattern for short-circuiting the first and fifth land patterns; and a connection pattern for short-circuiting the fourth and eighth land patterns.

According to the present invention, it is possible to simplify the pattern shape of the connection pattern for short-circuiting two terminal electrodes.

As described above, according to the present invention, there can be provided a coil component in which wire winding operation is facilitated even when the primary side coil and the secondary side coil differ in the number of turns and a circuit board having such a coil component.

BRIEF DESCRIPTION OF THE DRAWINGS

The above features and advantages of the present invention will be more apparent from the following description of certain preferred embodiments taken in conjunction with the accompanying drawings, in which:

FIG. 4A shows a position of the crossing area A1 of the wires W1 and W2, and FIG. 4B shows a position of the crossing area A2 of the wires W3 and W4;

FIG. 7A illustrates the winding pattern of the wires W1 and W2, and FIG. 7B illustrates the winding pattern of the wires W3 and W4.

DETAILED DESCRIPTION OF THE EMBODIMENTS

Preferred embodiments of the present invention will be explained below in detail with reference to the accompanying drawings.

Figure 1:
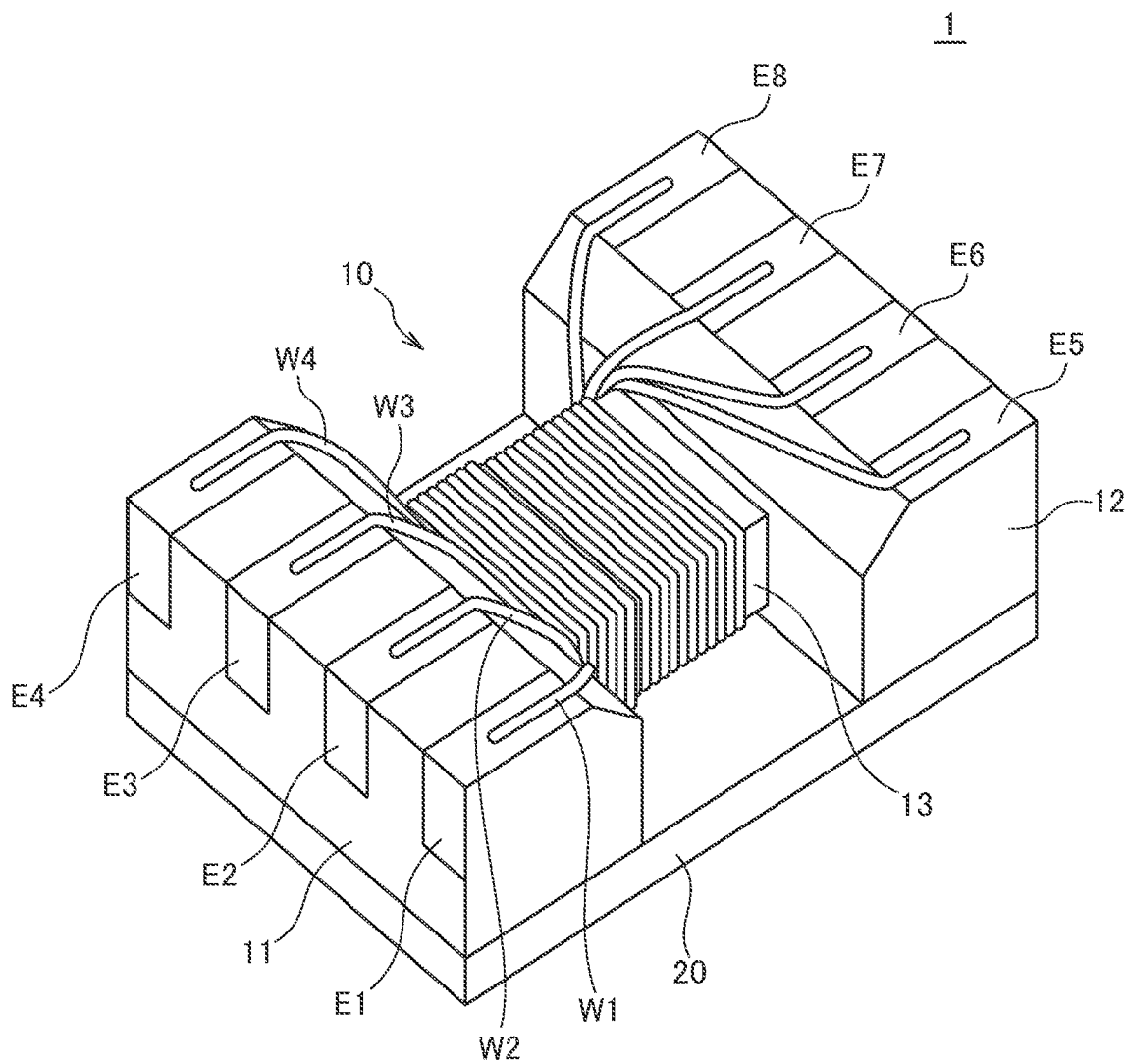
FIG. 1 is a schematic perspective view illustrating the outer appearance of a coil component 1 according to an embodiment of the present invention.
Figure 1:
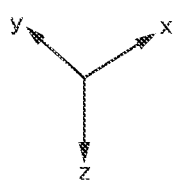

FIG. 1 is a schematic perspective view illustrating the outer appearance of a coil component 1 according to an embodiment of the present invention.

The coil component 1 according to the present embodiment is a pulse transformer and includes a drum-shaped core 10, a plate core 20, terminal electrodes E1 to E8, and wires W1 to W4, as illustrated in FIG. 1. As materials for the drum-shaped core 10 and plate core 20, magnetic materials having a high permeability such as ferrite are used. The magnetic materials used for the drum-shaped core 10 and plate core 20 may be mutually the same or different, and these preferably have a permeability μ of 10 H/m to 4000 H/m.

As illustrated in FIG. 1, the drum-shaped core 10 includes a winding core part 13 whose axial direction is the x-direction, a flange part 11 provided at one end of the winding core part 13 in the x-direction, and a flange part 12 provided at the other end of the winding core part 13 in the x-direction. The terminal electrodes E1 to E4 are provided on the flange part 11 and arranged in this order in the y-direction. The terminal electrodes E5 to E8 are provided on the flange part 12 and arranged in this order in the y-direction. The wires W1 to W4 are wound around the winding core part 13, and one and the other ends of each of the wires W1 to W4 are connected respectively to corresponding ones of the terminal electrodes E1 to E8. The yz cross section of the winding core part 13 is a chamfered rectangle.

Figure 2:
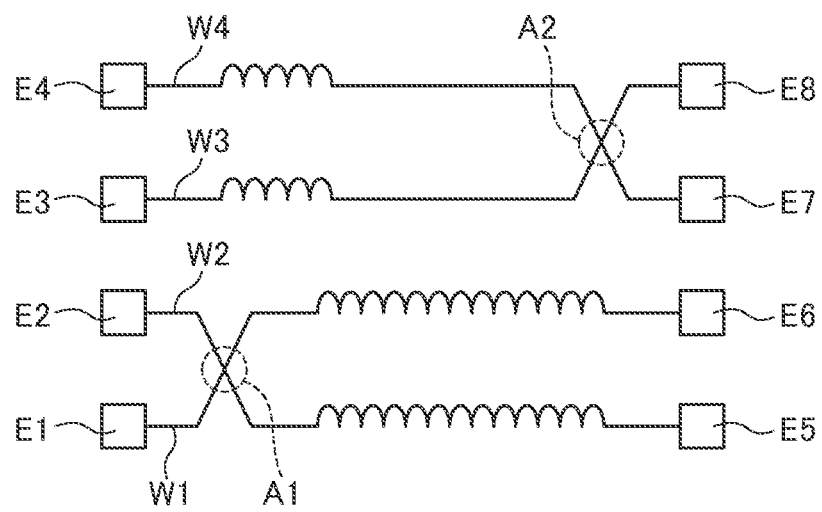
FIG. 2 is a schematic view for explaining the connection relationship between the wires W1 to W4 and the terminal electrodes E1 to E8.

FIG. 2 is a schematic view for explaining the connection relationship between the wires W1 to W4 and the terminal electrodes E1 to E8.

As illustrated in FIG. 2, one and the other ends of the wire W1 are connected respectively to the terminal electrodes E1 and E6, one and the other ends of the wire W2 are connected respectively to the terminal electrodes E2 and E5, one and the other ends of the wire W3 are connected respectively to the terminal electrodes E3 and E8, and one and the other ends of the wire W4 are connected respectively to the terminal electrodes E4 and E7. Of the wires W1 to W4, the wires W1 and W2 are paired and bifilar wound around the winding core part 13. Similarly, the wires W3 and W4 are paired and bifilar wound around the winding core part 13. It follows that the wires W1 and W2 are the same in the number of turns and the winding direction, and the wires W3 and W4 are the same in the number of turns and the winding direction. Although not particularly limited, in the present embodiment, the number of turns differs between the paired wires W1 and W2 and the paired wires W3 and W4. The winding direction is the same between the paired wires W1 and W2 and the paired wires W3 and W4.

Further, as illustrated in FIG. 2, the wires W1 and W2 cross each other in a crossing area A1, and the wires W3 and W4 cross each other in a crossing area A2. The crossing area A1 and the crossing area A2 are different in position on the winding core part 13. In the example illustrated in FIG. 2, the first turns of the wires W1 and W2 cross each other when the flange part 11 (terminal electrodes E1 and E2) is defined as the starting point of winding, and the first turns of the wires W3 and W4 cross each other when the flange part 12 (terminal electrodes E7 and E8) is defined as the starting point of winding.

Figure 3:
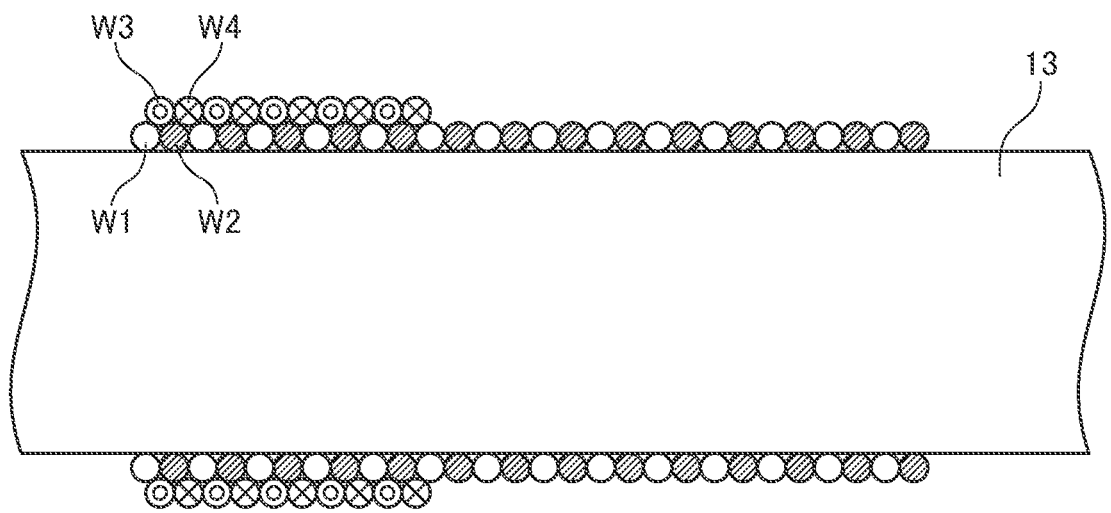
FIG. 3 is a schematic view for explaining the winding pattern of the wires W1 to W4 on the winding core part 13.

FIG. 3 is a schematic view for explaining the winding pattern of the wires W1 to W4 on the winding core part 13.

As illustrated in FIG. 3, in the present embodiment, the wires W1 and W2 are larger in the number of turns than the wires W3 and W4. Further, the wires W1 and W2 are wound in the lower layer, and the wires W3 and W4 are wound in the upper layer. That is, the wires W3 and W4 are wound around the winding core part 13 with the wires W1 and W2 interposed therebetween. Such a winding pattern is obtained by bifilar winding the wires W1 and W2 with a larger number of turns first and then bifilar winding the wirers W3 and W4 with a smaller number of turns. With this winding pattern, the wires W1 and W2 with a larger number of turns can be wound on the surface of the winding core part 13 in an aligned manner, and the wires W3 and W4 with a smaller number of turns can be wound along the valley line between the wires W1 and the wires W2 in an aligned manner, which makes winding collapse unlikely to occur.

Figure 4A:
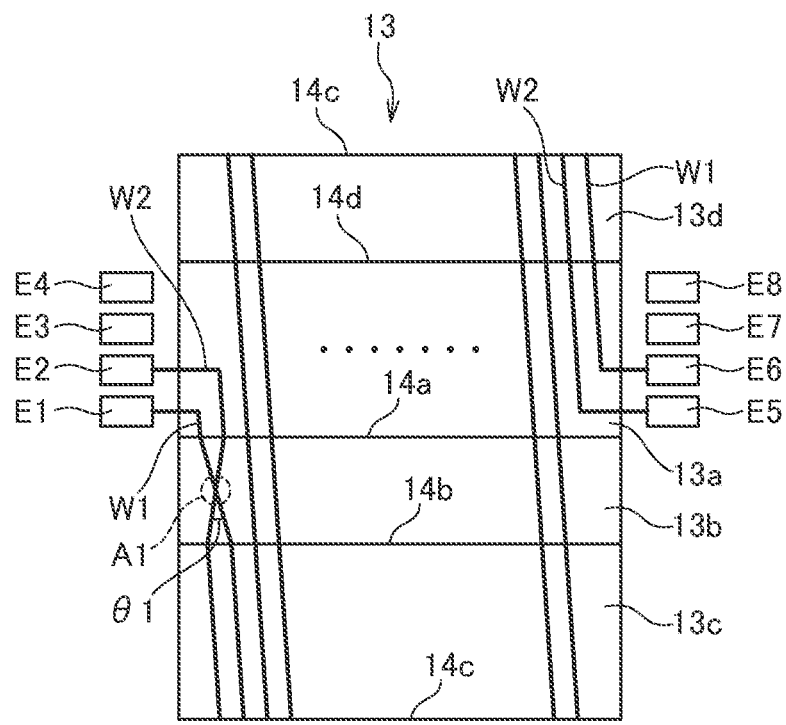
FIGS. 4A and 4B are each a developed view of the winding core part 13, where
Figure 4B:
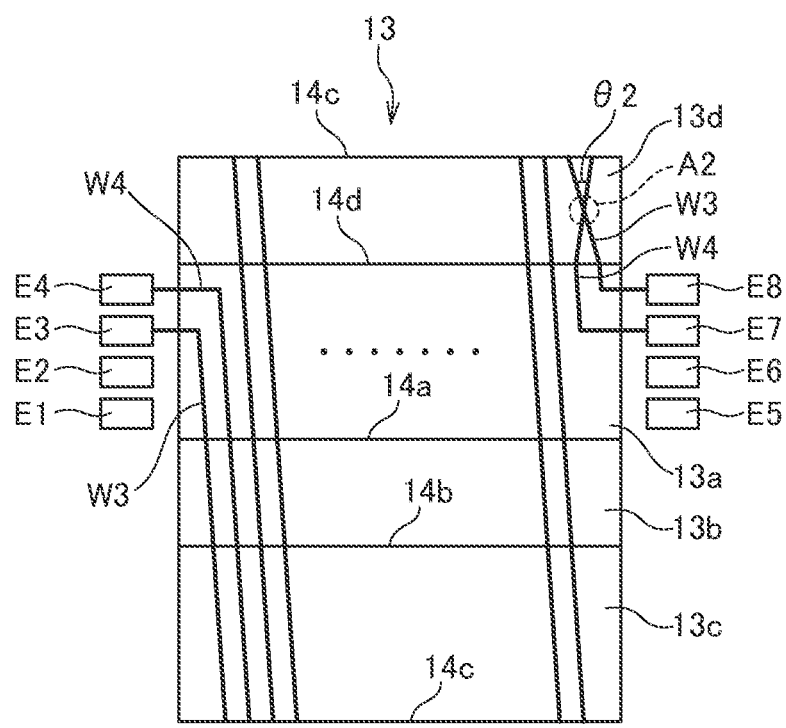

FIGS. 4A and 4B are each a developed view of the winding core part 13. The position of the crossing area A1 of the wires W1 and W2 is indicated in FIG. 4A, and the position of the crossing area A2 of the wires W3 and W4 is indicated in FIG. 4B.

As illustrated in FIGS. 4A and 4B, the winding core part 13 has four winding surfaces 13a to 13d. The winding surfaces 13a and 13c each constitute the xy plane, and the winding surfaces 13b and 13d each constitute the xz plane. In the present embodiment, the winding surfaces 13a and 13c are larger in area than the winding surfaces 13b and 13c, so that the extending length of the wires W1 and W4 is longer on the winding surfaces 13a and 13c than on the winding surfaces 13c and 13d.

The crossing area A1 of the wires W1 and W2 is positioned on the winding surface 13b, and the crossing area A2 of the wires W3 and W4 is positioned on the winding surface 13d. Since the extending length of the wires W1 to W4 is shorter on the winding surfaces 13b and 13d as described above, the distance between the crossing area A1 and the corners 14a and 14b of the winding core part 13 and the distance between the crossing area A2 and the corners 14c and 14d of the winding core part 13 are small, so that the x-direction positions of the wires W1 to W4 near the crossing points can be easily fixed at the corners 14a to 14d. Further, the terminal electrodes E1 and E2 are positioned closer to the winding surface 13b, and the wires W1 and W2 connected respectively to the terminal electrodes E1 and E2 cross each other on the winding surface 13b, so that a crossing angle θ1 is comparatively large. Similarly, the terminal electrodes E7 and E8 are positioned closer to the winding surface 13d, and the wires W3 and W4 connected respectively to the terminal electrodes E7 and E8 cross each other on the winding surface 13d, so that a crossing angle θ2 is comparatively large. As a result, the length of an area required for the wire crossing is reduced.

Figure 5:
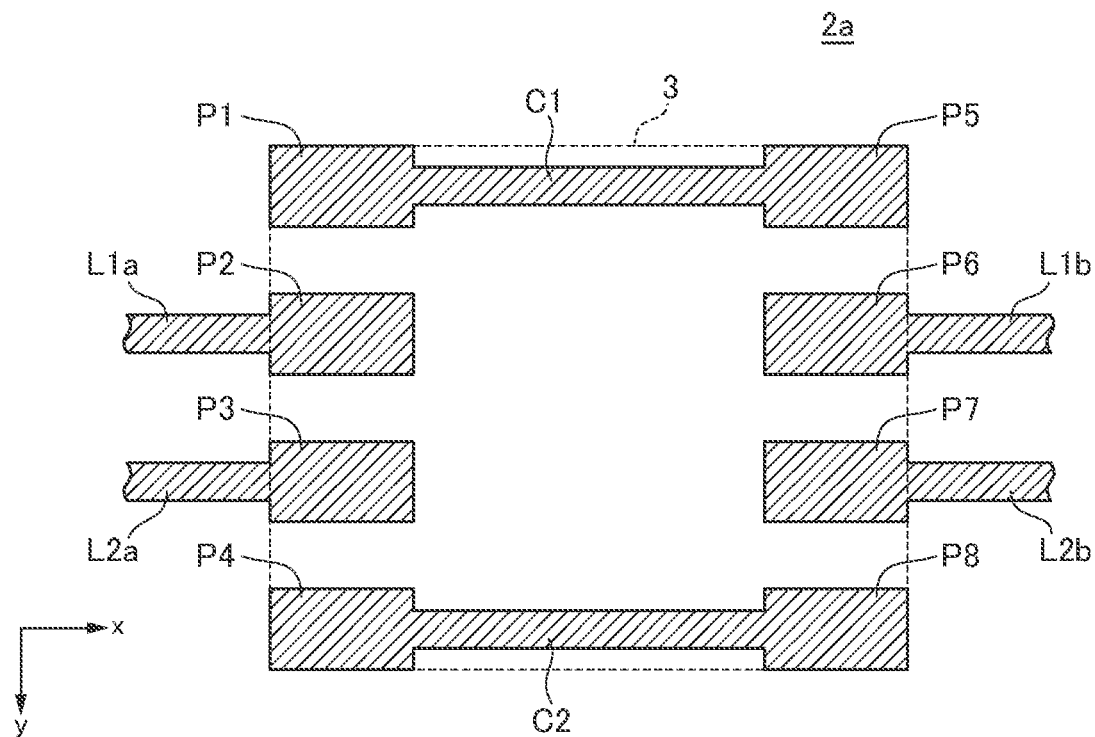
FIG. 5 is a schematic plan view illustrating the pattern shape of a substrate 2a on which the coil component 1 according to the present embodiment is mounted.

FIG. 5 is a schematic plan view illustrating the pattern shape of a substrate 2a on which the coil component 1 according to the present embodiment is mounted.

The substrate 2a illustrated in FIG. 5 is used as a circuit board including a pulse transformer when the coil component 1 is mounted thereon and has a mounting area 3 for the coil component 1. The mounting area 3 has eight land patterns P1 to P8. When the coil component 1 is mounted on the mounting area 3, the land patterns P1 to P8 are connected respectively to the terminal electrodes E1 to E8 of the coil component 1. The land patterns P2 and P6 constitute a pair of primary side terminals and are connected respectively to primary side wiring patterns L1a and L1b. On the other hand, the land patterns P3 and P7 constitute a pair of secondary side terminals and are connected respectively to secondary side wiring patterns L2a and L2b. However, the distinction between the primary side and the secondary side is relative, and they are interchangeable.

The land pattern P1 and the land pattern P5 are short-circuited to each other through a connection pattern C1 provided in the mounting area 3 and function as a primary side center tap. Similarly, the land pattern P4 and the land pattern P8 are short-circuited to each other through a connection pattern C2 provided in the mounting area 3 and function as a secondary side center tap.

Thus, when the coil component 1 according to the present embodiment is mounted on the substrate 2a, the terminal electrodes E1 and E5 are short-circuited through the connection pattern C1, and the terminal electrodes E4 and E8 are short-circuited through the connection pattern C2, whereby the coil component 1 functions as a pulse transformer having the primary side center tap and secondary side center tap.

Figure 6:
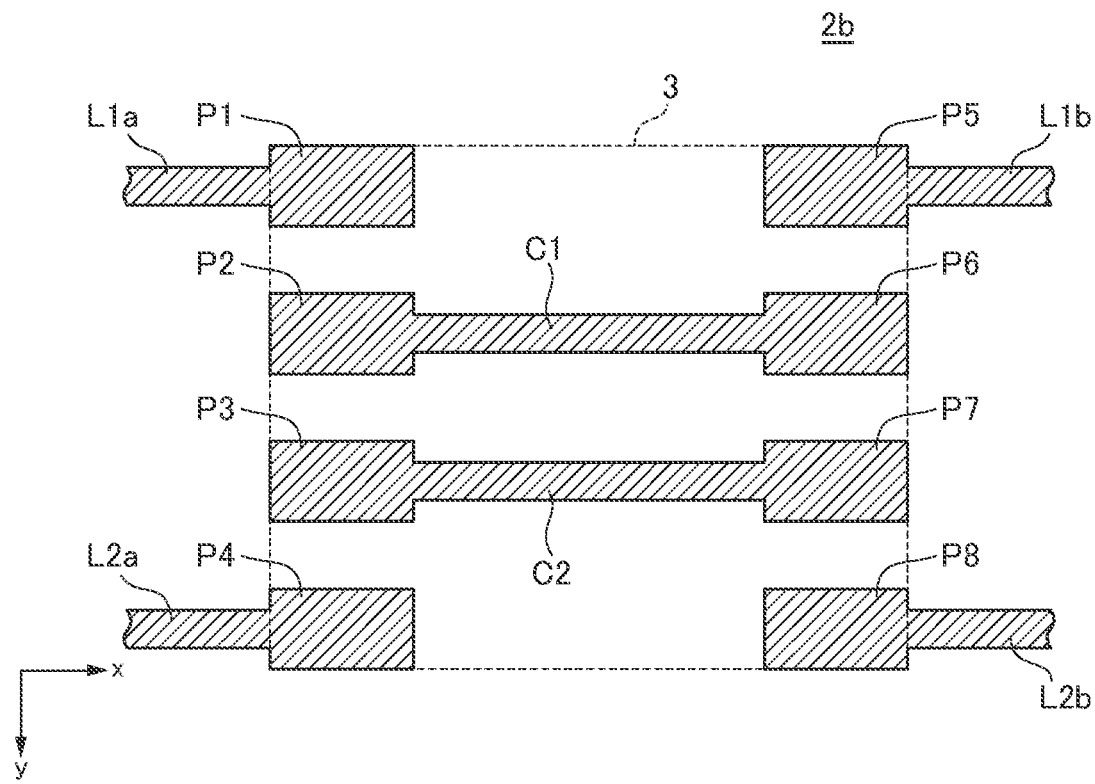
FIG. 6 is a schematic plan view illustrating the pattern shape of a substrate 2b according to a modification.

FIG. 6 is a schematic plan view illustrating the pattern shape of a substrate 2b according to a modification.

In the substrate 2b illustrated in FIG. 6, the land pattern P2 and the land pattern P6 are short-circuited to each other through the connection pattern C1, and the land pattern P3 and the land pattern P7 are short-circuited to each other through the connection pattern C2. On the other hand, the land patterns P1 and P5 constitute a pair of primary side terminals, and the land patterns P4 and P8 constitute a pair of secondary side terminals. Even when the coil component 1 is mounted on the mounting area 3 of the thus configured substrate 2b, it functions as a pulse transformer having the primary side center tap and secondary side center tap.

As described above, the coil component 1 according to the present embodiment can be used as a pulse transformer when being mounted on the substrate 2a having the connection patterns C1 and C2. Further, the wires W1 and W2 can be bifilar wound, and the paired wires W3 and W4 can be bifilar wound even the number of turns differs between the paired wires W1 and W2 and the paired wires W3 and W4, facilitating wire winding operation. Further, the wires W1 and W2 are made to cross each other, and the wires W3 and W4 are made to cross each other, whereby the connection patterns C1 and C2 can each be formed to have a shape linearly extending in the x-direction, contributing to a reduction in the wiring length of the connection patterns C1 and C2. In addition, the crossing area A1 of the wires W1 and W2 and the crossing area A2 of the wires W3 and W4 are different in position, so that it is possible to prevent breakage, winding collapse, and the like of the wires due to interference between the crossing areas A1 and A2.

Figure 7A:
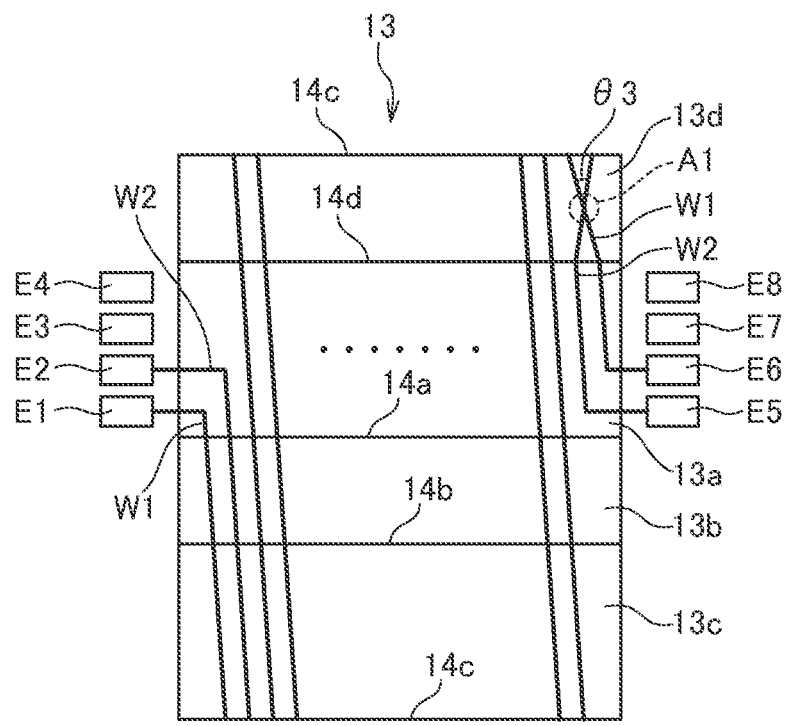
FIGS. 7A and 7B are each a schematic view for explaining the winding pattern of the wires W1 to W4 according to a first modification, where
Figure 7B:
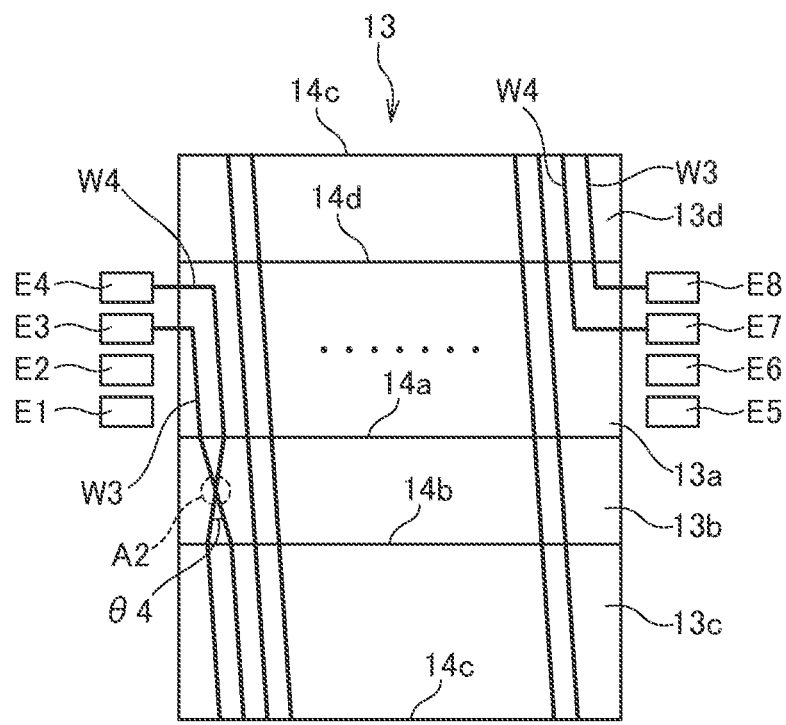

FIGS. 7A and 7B are each a schematic view for explaining the winding pattern of the wires W1 to W4 according to a first modification. FIG. 7A illustrates the winding pattern of the wires W1 and W2, and FIG. 7B illustrates the winding pattern of the wires W3 and W4.

In the winding pattern illustrated in FIGS. 7A and 7B, the first turns of the wires W1 and W2 cross each other on the winding surface 13d when the flange part 12 (terminal electrodes E5 and E6) is defined as the starting point of winding, and the first turns of wires W3 and W4 cross each other on the winding surface 13b when the flange part 11 (terminal electrodes E3 and E4) is defined as the starting point of winding. Even with such a winding pattern, substantially the same effects as those obtained by the winding pattern illustrated in FIGS. 4A and 4B can be achieved. However, a crossing angle θ3 between the wires W1 and W2 on the winding surface 13d and a crossing angle θ4 between the wires W3 and W4 on the winding surface 13b are likely to be smaller than the crossing angles θ1 and θ2 and, in this case, the length of an area required for the wire crossing is increased. Considering this, it is preferable to adopt the winding pattern illustrated in FIG. 4.

Figure 8:
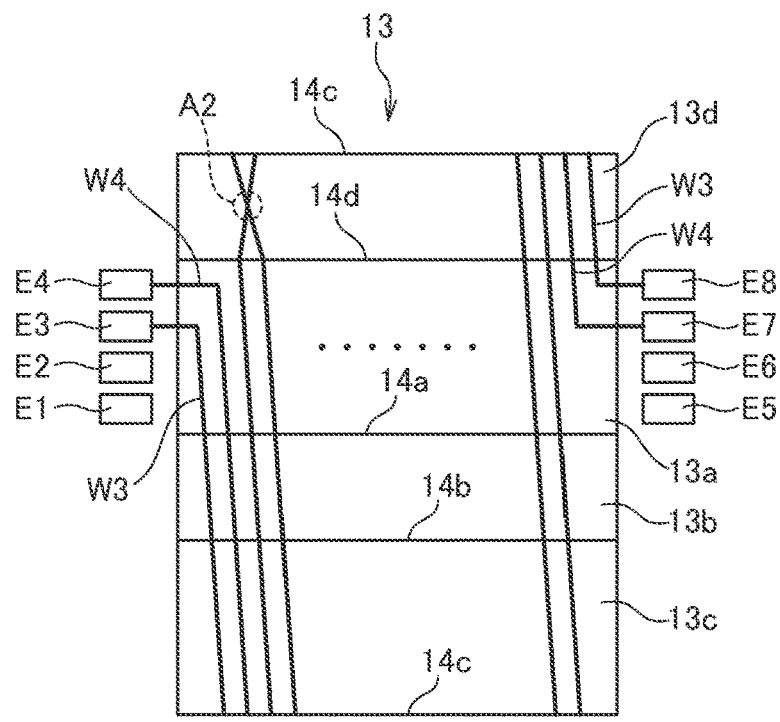
FIG. 8 is a schematic view for explaining the winding pattern of the wires W3 and W4 according to a second modification.

FIG. 8 is a schematic view for explaining the winding pattern of the wires W3 and W4 according to a second modification. The corresponding winding pattern of the wires W1 and W2 is as illustrated in FIG. 4A.

In the winding pattern illustrated in FIG. 8, the first turns of the wires W3 and W4 cross each other on the winding surface 13d when the flange part 11 (terminal electrodes E3 and E4) is defined as the starting point of winding. Thus, even when both the crossing areas A1 and A2 are located at positions corresponding to the first turns of the wires W1 to W4 when the flange part 11 is defined as the starting point of winding, the crossing areas A1 and A2 are located on different winding surfaces, so that it is possible to prevent interference therebetween.

Figure 9:
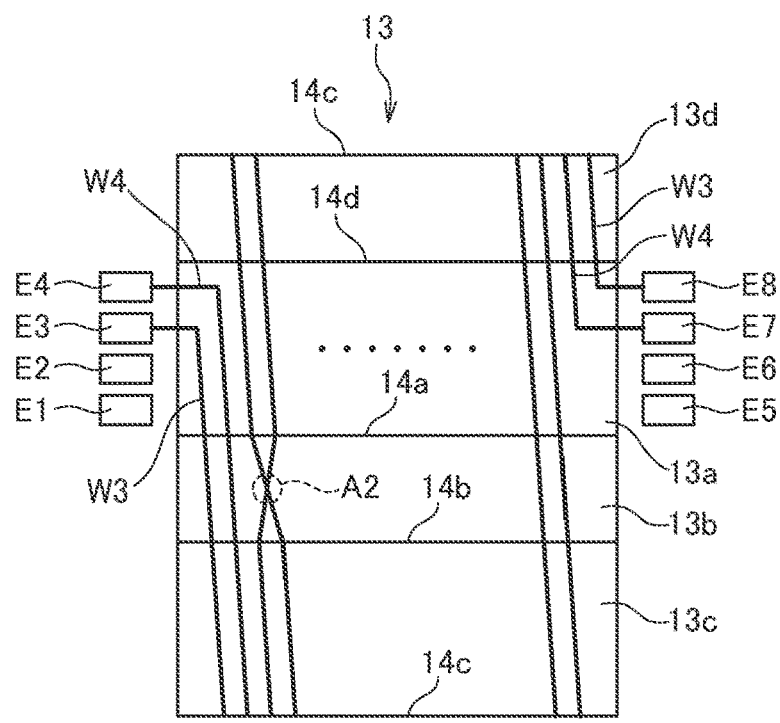
FIG. 9 is a schematic view for explaining the winding pattern of the wires W3 and W4 according to a third modification.

FIG. 9 is a schematic view for explaining the winding pattern of the wires W3 and W4 according to a third modification. The corresponding winding pattern of the wires W1 and W2 is as illustrated in FIG. 4A.

In the winding pattern illustrated in FIG. 9, the second turns of the wires W3 and W4 cross each other on the winding surface 13b when the flange part 11 (terminal electrodes E3 and E4) is defined as the starting point of winding. Thus, even when both the crossing areas A1 and A2 are positioned on the same winding surface 13b, the turn position of the wires W1 and W2 corresponding to the crossing area A1 and the turn position of the wires W3 and W4 corresponding to the crossing area A2 differ from each other, so that it is possible to prevent interference between the crossing areas A1 and A2.

Figure 10:
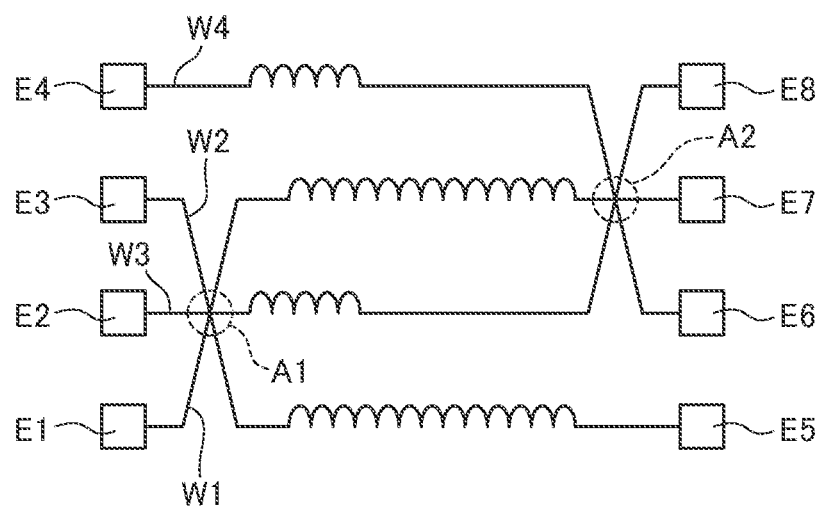
FIG. 10 is a schematic view for explaining the connection relationship between the wires W1 to W4 and the terminal electrodes E1 to E8 according to a modification.

FIG. 10 is a schematic view for explaining the connection relationship between the wires W1 to W4 and the terminal electrodes E1 to E8 according to a modification.

In the example illustrated in FIG. 10, one and the other ends of the wire W1 are connected respectively to the terminal electrodes E1 and E7, one and the other ends of the wire W2 are connected respectively to the terminal electrodes E3 and E5, one and the other ends of the wire W3 are connected respectively to the terminal electrodes E2 and E8, and one and the other ends of the wire W4 are connected respectively to the terminal electrodes E4 and E6. The coil component having such a connection relationship also functions as a pulse transformer having the primary side center tap and secondary side center tap, like the coil component 1 according to the above-described embodiment, when it is mounted on the substrate 2a illustrated in FIG. 5 or the substrate 2b illustrated in FIG. 6.

While the preferred embodiments of the present invention have been described, the present invention is not limited to the above embodiments, and various modifications may be made within the scope of the present invention. Accordingly, all such modifications are included in the present invention.

It is apparent that the present invention is not limited to the above embodiments, but may be modified and changed without departing from the scope and spirit of the invention.

Further, although the crossing areas A1 and A2 are positioned on the winding surface 13b or 13d in the above embodiment, they may be positioned on the winding surface 13a or 13c.

What is claimed is:

1. A coil component comprising:
    a core including a first flange part, a second flange part, and a winding core part positioned between the first and second flange parts;
    first, second, third, and fourth terminal electrodes provided on the first flange part;
    fifth, sixth, seventh, and eighth terminal electrodes provided on the second flange part;
    first and second wires bifilar wound around the winding core part; and
    third and fourth wires bifilar wound around the winding core part,
    wherein the first, second, third, and fourth terminal electrodes are arranged in this order in a direction perpendicular to an axial direction of the winding core part,
    wherein the fifth, sixth, seventh, and eighth terminal electrodes are arranged in this order in the direction perpendicular to the axial direction of the winding core part,
    wherein one and other ends of the first wire are connected respectively to the first and sixth terminal electrodes,
    wherein one and other ends of the second wire are connected respectively to the second and fifth terminal electrodes,
    wherein one and other ends of the third wire are connected respectively to the third and eighth terminal electrodes,
    wherein one and other ends of the fourth wire are connected respectively to the fourth and seventh terminal electrodes,
    wherein the first and second wires cross each other in a first crossing area, and
    wherein the third and fourth wires cross each other in a second crossing area different from the first crossing area.

2. The coil component as claimed in claim 1, wherein a turn number of the first and second wires in the first crossing area when the first flange part is defined as a starting point of winding is different from a turn number of the third and fourth wires in the second crossing area when the first flange part is defined as a starting point of winding.

3. The coil component as claimed in claim 2,
    wherein first turns of the first and second wires cross each other in the first crossing area when the first flange part is defined as a starting point of winding, and
    wherein first turns of the third and fourth wires cross each other in the second crossing area when the second flange part is defined as a starting point of winding.

4. The coil component as claimed in claim 1,
    wherein the winding core part has a plurality of winding surfaces, and
    wherein the first and second crossing areas are positioned on mutually different winding surfaces.

5. The coil component as claimed in claim 4,
    wherein the plurality of winding surfaces include first, second, and third winding surfaces,
    wherein an extending length of the first, second, third, and fourth wires on the first winding surface is longer than an extending length of the first, second, third, and fourth wires on each of the second and third winding surfaces, and
    wherein the first and second crossing areas are positioned on the second and third winding surfaces, respectively.

6. The coil component as claimed in claim 1, wherein a number of turns of the first and second wires is different from a number of turns of the third and fourth wires.

7. The coil component as claimed in claim 6,
    wherein the number of turns of the first and second wires is larger than the number of turns of the third and fourth wires, and
    wherein the third and fourth wires are wound around the winding core part with the first and second wires interposed therebetween.

8. A circuit board comprising:
    a substrate; and
    a coil component mounted on the substrate,
    wherein the coil component comprising:
        a core including a first flange part, a second flange part, and a winding core part positioned between the first and second flange parts;
        first, second, third, and fourth terminal electrodes provided on the first flange part;

fifth, sixth, seventh, and eighth terminal electrodes provided on the second flange part;
first and second wires bifilar wound around the winding core part; and
third and fourth wires bifilar wound around the winding core part,
wherein one and other ends of the first wire are connected respectively to the first and sixth terminal electrodes,
wherein one and other ends of the second wire are connected respectively to the second and fifth terminal electrodes,
wherein one and other ends of the third wire are connected respectively to the third and eighth terminal electrodes,
wherein one and other ends of the fourth wire are connected respectively to the fourth and seventh terminal electrodes,
wherein the first and second wires cross each other in a first crossing area,
wherein the third and fourth wires cross each other in a second crossing area different from the first crossing area, and
wherein the substrate comprises:
first to eighth land patterns connected respectively to the first to eighth terminal electrodes;
a first connection pattern for short-circuiting the first and fifth land patterns; and
a second connection pattern for short-circuiting the fourth and eighth land patterns.

9. The circuit board as claimed in claim 8,
wherein the first, second, third, and fourth land patterns are arranged in this order, and
wherein the fifth, sixth, seventh, and eighth land patterns are arranged in this order.

10. A coil component comprising:
a core including a first flange part, a second flange part, and a winding core part positioned between the first and second flange parts;
first, second, third, and fourth terminal electrodes provided on the first flange part;
fifth, sixth, seventh, and eighth terminal electrodes provided on the second flange part; and
first, second, third, and fourth wires wound around the winding core part,
wherein one end of each of the first, second, third, and fourth wires is connected to an associated one of the first, second, third, and fourth terminal electrodes,
wherein other end of each of the first, second, third, and fourth wires is connected to an associated one of the fifth, sixth, seventh, and eighth terminal electrodes,
wherein each of the first and second wires is larger in a number of turns than each of the third and fourth wires,
wherein the third and fourth wires are wound on the first and second wires,
wherein the winding core part includes first and second winding surfaces,
wherein the first and second wires cross each other on the first winding surface, and
wherein the third and fourth wires cross each other on the second winding surface.

11. The coil component as claimed in claim 10, wherein the first and second winding surfaces face opposite direction.

12. The coil component as claimed in claim 11,
wherein the winding core part further includes third and fourth winding surfaces facing opposite direction, and
wherein each of the third and fourth winding surfaces is greater in area than each of the first and second winding surfaces.

13. The coil component as claimed in claim 12,
wherein the first and second wires do not cross each other on the third and fourth winding surfaces, and
wherein the third and fourth wires do not cross each other on the third and fourth winding surfaces.

14. The coil component as claimed in claim 10,
wherein the winding core part includes a first section located at the first flange part side and a second section located at the second flange part side,
wherein the first and second wires are wound around the first and second sections, and
wherein the third and fourth wires are wound around the first section without wound around the second section.

15. The coil component as claimed in claim 14, wherein the second section is longer in an axial direction than the first section.

* * * * *